United States Patent
Chadebec et al.

(10) Patent No.: US 7,171,342 B2
(45) Date of Patent: Jan. 30, 2007

(54) METHOD FOR DETERMINING MAGNETIZATION AND THE FIELD RADIATED BY A FERROMAGNETIC PLATE

(75) Inventors: Olivier Chadebec, Grenoble (FR); Jean-Louis Coulomb, Saint Ismier (FR)

(73) Assignees: Etat Francais Represente par le Delegue General pour l'Armement, Arcueil (FR); Institut National Polytechnique de Grenoble, Grenoble (FR)

(*) Notice: Subject to any disclaimer, the term of this patent is extended or adjusted under 35 U.S.C. 154(b) by 674 days.

(21) Appl. No.: 10/343,932

(22) PCT Filed: Jun. 12, 2002

(86) PCT No.: PCT/FR02/02007

§ 371 (c)(1),
(2), (4) Date: May 14, 2003

(87) PCT Pub. No.: WO02/101405

PCT Pub. Date: Dec. 19, 2002

(65) Prior Publication Data

US 2003/0184284 A1    Oct. 2, 2003

(30) Foreign Application Priority Data

Jun. 12, 2001   (FR) .................................. 01 08292

(51) Int. Cl.
*G06F 17/10* (2006.01)
(52) U.S. Cl. .................. 703/2; 702/49; 324/207.18
(58) Field of Classification Search ............ 703/2, 703/6; 114/355; 324/207.18, 207.26, 239; 367/134; 73/862.541; 361/149; 702/38, 702/49

See application file for complete search history.

(56) References Cited

U.S. PATENT DOCUMENTS 3,609,527 A * 9/1971 Ellis ..................... 324/207.18

(Continued)

OTHER PUBLICATIONS

Polvani, D. Current and Future Underwater Magnetic Sensing, IEEE, OCEANS, vol. 13, Sep. 1981, pp. 442-446.*

(Continued)

*Primary Examiner*—Russell Frejd
(74) *Attorney, Agent, or Firm*—Oliff & Berridge, PLC (57) ABSTRACT

The invention concerns the field of devices and appliances for measuring the intensity and the direction of the magnetic field emitted by a plate or a structure, such as for example a ship's hull and it particularly concerns a method for determining the magnetisation and the magnetic field radiated by a ferromagnetic plate using magnetic field sensors distributed along said plate and at known positions relative thereto. The invention is characterised in that it consists in: producing a mesh of said plate by clipping into elementary surfaces; producing a first modelling of the magnetic field associated with measurements and based on the produced surface meshing of the plate, on its thickness, on measurements, on co-ordinates of measurement points and on the excitation $B_0 = \mu_0 H_0$; producing a second modelling of the physical behaviour of the material forming the plate based on the mesh, its thickness, the excitation, and the reversible permeability of the material; calculating the permanent and induced magnetisation levels of each of the elementary surfaces based on said first and second modelling and on the measurements performed by said magnetic field sensors; calculating the magnetic signature of the plate in every point based on said permanent and induced magnetisation levels of each of the elementary surfaces, the surface mesh produced on the plate, its thickness, measurements, co-ordinates of the calculation points and the excitation $B_0 = \mu_0 H_0$.

11 Claims, 6 Drawing Sheets

U.S. PATENT DOCUMENTS

| | | | | |
|---|---|---|---|---|
| 3,644,825 A | * | 2/1972 | Davis et al. | 324/207.26 |
| 4,059,011 A | * | 11/1977 | Reiss | 73/862.541 |
| 4,070,625 A | * | 1/1978 | Harpster | 324/239 |
| 4,932,006 A | * | 6/1990 | Delignieres | 367/134 |
| 5,189,590 A | * | 2/1993 | Schneider | 361/149 |

OTHER PUBLICATIONS

Pinheiro, J.C.A. Vectorial Magnetic Field of a Vessel from the Vertical Field, IEEE, OCEANS '94, Oceans Engineering for Today's Technology and Tomorrow's Preservation, vol. 3, Sep. 1994, pp. III/519-III/521.*

Duthoit et al., F.M. The Boundary Integral Equation Method for the Extrapolation of Field Measurement, IEEE Transactions on Magnetics, vol. MAG-21, No. 6, Nov. 1985, pp. 2439-2442.*

Kildishev et al., A.V. Multipole Imaging of an Elongated Magnetic Source, IEEE Transactions on Magnetics, vol. 36, No. 5, Sep. 2000, pp. 3108-3111.*

* cited by examiner

METHOD FOR DETERMINING MAGNETIZATION AND THE FIELD RADIATED BY A FERROMAGNETIC PLATE

The invention relates to arrangements and apparatus for measuring the intensity and direction of the magnetic field transmitted by a plate or structure such as the hull of a ship as well as to arrangements for demagnetization of ships.

BACKGROUND

It is known that the presence of magnetic materials on board a ship renders it detectable and identifiable by means for detecting its magnetic signature, usually called magnetic anomaly detectors. These detection means can for example be carried on board a ship, a mine, a torpedo, a missile, or an aircraft.

The use of nonmagnetic materials for limiting the magnetic signature of a ship is known. However, ferromagnetic materials do remain on board. For cost reasons, it appears preferable to make a ferromagnetic metal hull and to generate magnetic fields that compensate those connected to the hull itself using field sensors (magnetometers) installed inside the ship and immunization loops.

However, to achieve this compensation, it is necessary first to determine the magnetization of the hull. Once this magnetization is known, the currents, in each of the immunization coils, needed for this compensation can be determined.

SUMMARY

One of the goals of the invention is to provide a method for estimating the magnetization of a sheet (thin steel ferromagnetic sheet) using field sensors (magnetometers), and deduce the field radiated by the sheet everywhere outside this sheet.

The magnetization of a ferromagnetic material is the result of adding the induced magnetization, which corresponds to the magnetization assumed by the material under the influence of an inductive field, the terrestrial field for example, to the permanent magnetization which depends on the history of the material. The induced magnetization is fully deterministic and depends only on the inductive field, the geometry of the sheet (the hull), and the relative permeability of the material, whereas the permanent magnetization changes gradually according to the inductive field, heat stresses, pressure stresses, or even manufacturing conditions. There are many parameters, and they are difficult to monitor. Hence, permanent magnetization cannot be modeled and can only be estimated by measuring the field it induces. Because of this, and to determine the total magnetization of a sheet, a model must be built to connect the measurement to the magnetization, then inverted so that the magnetization can be deduced. This leads to all the difficulties inherent in solving inverted problems.

To bypass this problem one may cite French Patent 2679514 which describes a portable station for measuring and adjusting the magnetic signature of a naval vessel to determine and modify the characteristics of currents circulating in the magnetic immunization loops with which this vessel is provided.

This station has several magnetic sensors forming a deformable string that can be placed on the seabed and connected to the vessel by means for transmitting and receiving signals generated by the sensors.

The method for determining the magnetic signature of the vessel consists of:

evaluating the shape of the sensor string to determine the relative positions of the sensors, determining the position of the vessel relative to said sensor string, determining a path and assembling data from the sensors during at least one passage of the vessel along said path.

With a string of sensors necessarily located outside the ship, this method enables the visible far-field magnetization to be estimated, but does not enable the magnetization of an anomaly to be estimated using sensors placed inside the ship.

At the present time, one known method for determining the signature of a metal-hulled ship from measurements taken inside it consists of determining, by inverting a linear system, not the magnetization but rather the distribution of a mathematical magnitude known as magnetic charge at the nodes of the meshed surface of the hull then deducing the field from the defined reference distance. This method attempts to estimate a charge at each node of the surface mesh by viewing it as an independent element decorrelated from its neighbors. This solution requires a large number of sensors to be used since there are as many parameters to be estimated as there are nodes defining the mesh. Moreover, the charge distribution obtained is not necessarily physical and the result in terms of signature is likely to be unstable.

The goal of the invention is to overcome the aforementioned drawbacks by providing a method for making a physical estimate of the total induced and permanent magnetization of a sheet. This magnetization can then be used to estimate the field at all points and enables the reference signature of a metal-hulled ship to be estimated. Moreover, the sensors can be located inside or outside the magnetic anomaly, namely the sheet or hull.

In addition, the estimated magnetization can be used by a device that directly offsets the magnetizations, based on a calculation of the immunization loop currents to minimize the magnetization of the hull directly rather than the field estimated from reference points. Such a compensation method has the advantage of minimizing the field at all points, both above the hull with a view to risks from the air and below the hull with a view to mine and torpedo hazards. This avoids the double sets of adjustments usually encountered in operational procedures aboard ship to cover both airborne detection risks (from an aircraft) and risks from mines.

The invention consists of a method for determining the magnetization of the field radiated by a ferromagnetic sheet using magnetic field sensors distributed along this sheet at known positions relative to said sheet, characterized by consisting of:

Meshing this sheet by dividing it up into elementary surfaces,

Creating a first magnetic field model that is associated with the measurements and is a function of the surface mesh of the sheet, its thickness, the measurements, the coordinates of the measurement points, and the inductive field $B_0 = \mu_0 H_0$, Creating a second model of the physical behavior of the material of which the sheet is made from the mesh, its thickness, the inductive field, and the reversible permeability of the material, Calculating the permanent and induced magnetizations of each of the elementary surfaces from said first and second models and the measurements made by said magnetic field sensors, Calculating the magnetic signature of the sheet at all points from said permanent and induced magnetizations of each of the elementary surfaces, from the surface mesh produced in the sheet, its thickness, the measurements, the coordinates of the calculation points, and the inductive field $B_0 = \mu_0 H_0$.

The word "sheet" should be understood either as a single sheet or as a set of sheets thus delimiting a volume.

According to one particular feature, characterized in that the first modeling procedure consists of modeling the magnetic field by as one of the following formulas:

$$B = B_0 + \frac{e\mu_0}{4\pi} \sum_{N_1} \int_{L_i} M_i \cdot n_i \frac{\vec{r}}{r^3} dL_i$$

$$B = B_0 - \frac{e\mu_0}{4\pi} \sum_{N_1} grad \int_{S_i} \int M_i \cdot \frac{\vec{r}}{r^3} dS_i$$

where
$M_i$ is the total magnetization, namely the sum of the permanent magnetization $M_i^{per}$ and the induced magnetization $M_i^{ind}$ of element i,
$N_1$ is the number of elementary surfaces,
$L_i$ the edges of the elementary surfaces,
$S_i$ the elementary surfaces,
r is the distance between the current point of the edge i and the measurement point,
$n_i$ is the perpendicular to the edge i of the current surface element, tangential to the element,
e is the thickness of the hull,
namely a matrix system taking the following matrix form:

$B - Bo = FM = FM^{ind} + FM^{per}$

According to another particular feature guaranteeing a high resistance to errors and measuring noise so that it can be operated in a real-life environment, the second modeling procedure consists of modeling the magnetic field for each of the surface elements by one of the following formulas:

$$\frac{M_i^{ind}}{(\mu_r - 1)} = H_0 - \frac{e}{4\pi} \sum_{N_1} \int_{L_j} M_j^{ind} \cdot n_j \frac{\vec{r}_{ij}}{r_{ij}^3} dL_j - $$

$$\frac{e}{4\pi} \sum_{N_1} \int_{L_j} M_j^{per} \cdot n_j \frac{\vec{r}_{ij}}{r_{ij}^3} dL_j$$

$$\frac{M_i^{ind}}{(\mu_r - 1)} = H_0 + \frac{e}{4\pi} \sum_{N_1} grad \int_{S_j} \int M_j^{ind} \frac{\vec{r}_{ij}}{r_{ij}^3} dS_j + $$

$$\frac{e}{4\pi} \sum_{N_1} grad \int_{S_j} \int M_j^{per} \frac{\vec{r}_{ij}}{r_{ij}^3} dS_j$$

where,
$M_j^{ind}$ is the induced magnetization of the elementary surface j,
$M_j^{per}$ is the permanent magnetization of the elementary surface j, $N_1$ is the number of elementary surfaces,
$L_j$ the edges of the elementary surfaces,
$S_j$ the elementary surfaces,
$r_{ij}$ is the distance between the centers of mass of surface elements i and j,
$n_j$ is the perpendicular to edge i of the current surface element, tangential to the element,
e is the hull thickness,
namely, as a whole, a matrix system assuming the following matrix form:

$(C + Id) M^{ind} + CM^{per} = f(H_0)$

According to one particular feature, the permanent and induced magnetizations of each of the elementary surfaces are calculated by resolving the following matrix system, its solution being M:

$$\begin{bmatrix} F & F \\ C + Id & C \end{bmatrix} \begin{bmatrix} M^{ind} \\ M^{per} \end{bmatrix} = \begin{bmatrix} B - Bo \\ D \end{bmatrix}$$

According to an additional feature, the magnetic signature S of the sheet at a point I is calculated by one of the following formulas:

$$S = B_0 + \frac{e\mu_0}{4\pi} \sum_{N_1} \int_{L_i} \tilde{M}_i \cdot n_i \frac{\vec{r}}{r^3} dL_i$$

$$S = B_0 - \frac{e\mu_0}{4\pi} \sum_{N_1} grad \int_{S_i} \int \tilde{M}_i \cdot \frac{\vec{r}}{r^3} dS_i$$

$\tilde{M}$ represents the estimated magnetic signature
$N_1$ is the number of surface elements (triangular or quadrangular facet)
$L_i$ the edges of the elements,
$S_i$ the surfaces of the elements,
r is the distance between the center of mass of the current surface element and the field calculation point,
$n_i$ is the perpendicular to the edge i of the current surface element, tangential to the element,
e is the hull thickness.

According to another feature, a method according to the invention includes a step consisting of offsetting the magnetization of the sheet or its magnetic signature by using a system of immunization loops located in the vicinity of the sheet and in which a current with adjustable intensity I can be generated, which step may consist of establishing a linear system G connecting the currents I to the magnetizations M' that they generate on the sheet and which is a function of the geometries of the sheet and the loops, and then minimizing the function $\tilde{M} - M'$; minimization of the function $\tilde{M} - M'$ may be carried out by the least-squares method.

A method according to the invention can in particular be applied to determining the magnetic signature of the hull of a ship and even to determining the magnetization and the magnetic signature of an entire ship. It can be applied to determining the magnetization and the magnetic signature of a ferromagnetic structure.

Other features and advantages of the invention will emerge from reading the following description of a preferred embodiment of the invention provided as a simple illustrative and nonlimiting example, and the attached drawings wherein:

DETAILED DESCRIPTION OF THE EMBODIMENTS

Figure 1:
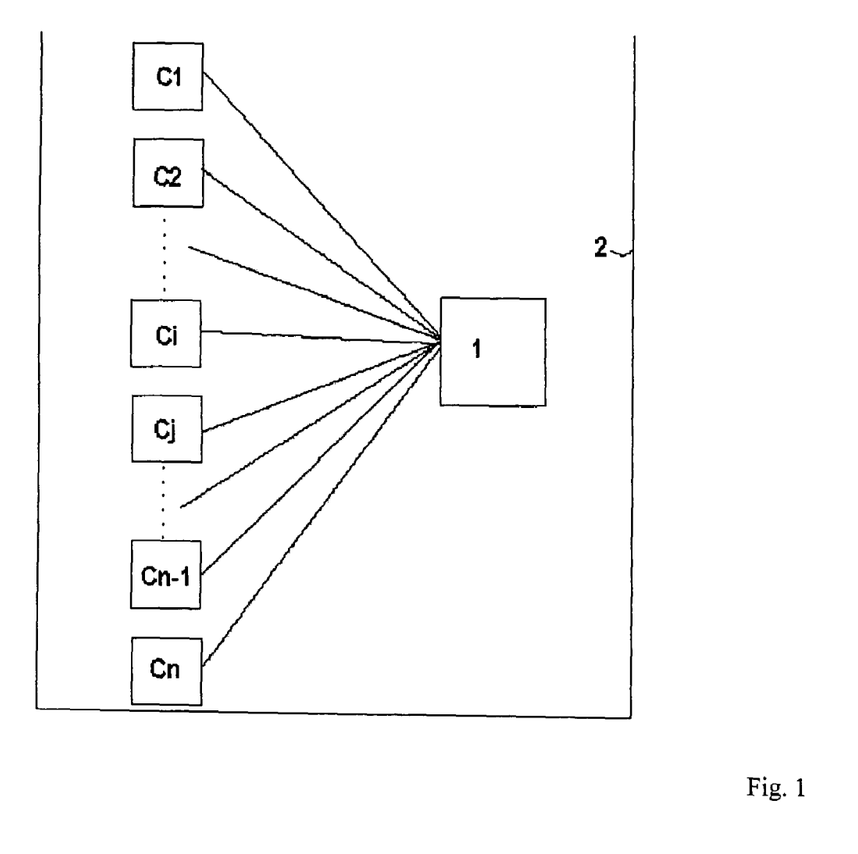
FIG. 1 shows the means whereby a method according to the invention is implemented.

FIG. 1 shows the means for implementing a method according to the embodiment of the invention. These means comprise n magnetic sensors C1 to Cn, for example magnetometers, each being able to transmit a signal to means 1 for processing these signals, specifically a microcomputer.

This computer and these sensors are located inside the hull 2 of a ship.

Figure 2:
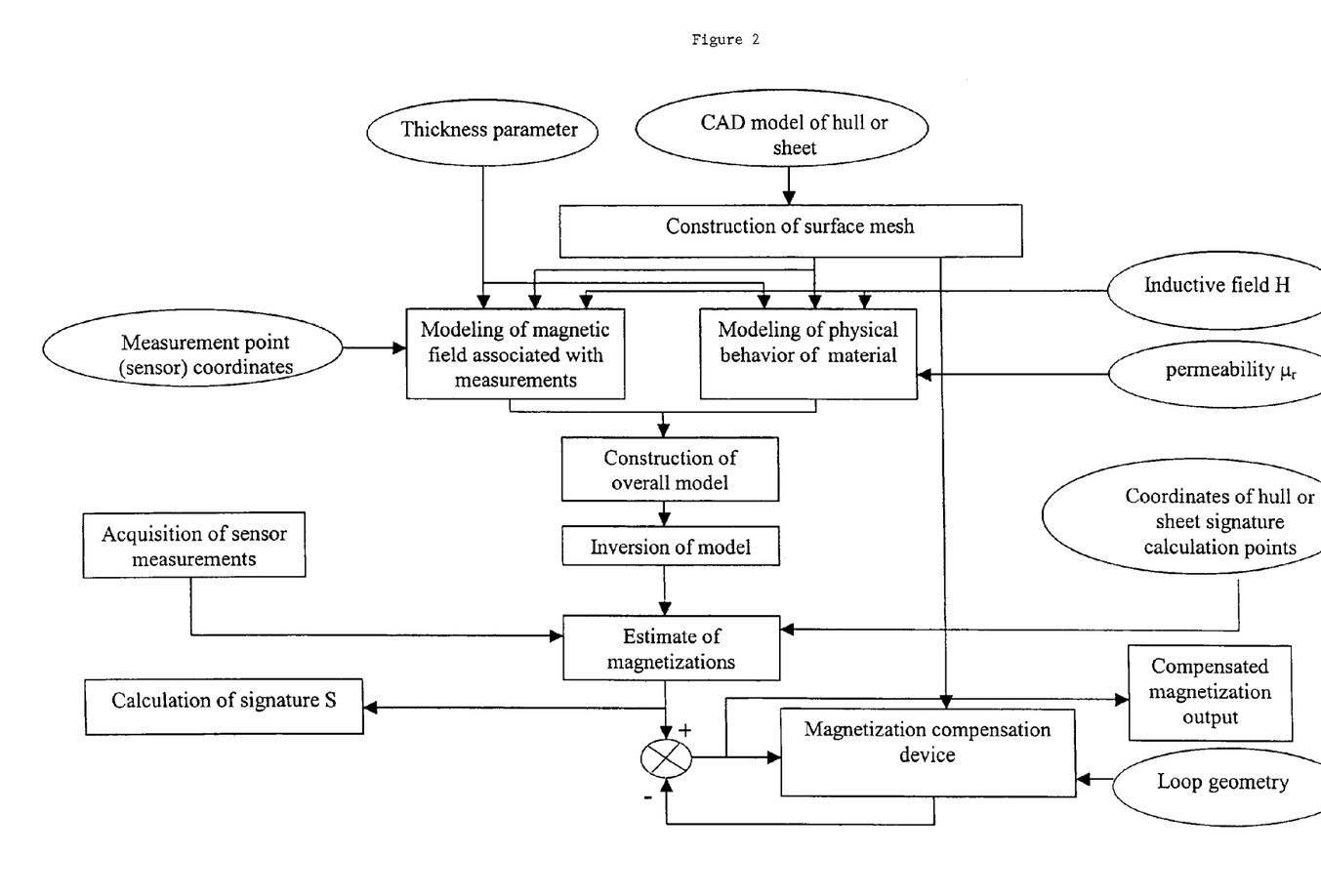
FIG. 2 is a diagram of the various steps of a method according to the preferred embodiment.

The method according to the preferred embodiment described consists, in the first step, of making a model, for example by computer aided design, of the hull 2 of the ship, preserving the proportions of the various surfaces, after which a surface mesh is created over the entire surface of the hull, where each elementary surface can for example be comprised of a triangle or a square as shown in FIG. 2, the positions of each of the elementary surfaces being defined with respect to a predetermined triaxial frame of reference.

The next step is to establish a model associated with the measurements made by the n sensors C2 to Cn.

The model, called F, associated with the measurements called B, uses knowledge of the geometric model composed of the surface mesh of the hull, its thickness, the measurements, the coordinates of the measurement points, and the inductive field $B_0 = \mu_0 H_0$ ($\mu_0$ is the permeability of vacuum or air):

$$B = B_0 + \frac{e\mu_0}{4\pi} \sum_{N_1} \int_{L_i} M_i \cdot n_i \frac{\vec{r}}{r^3} dL_i$$

$$B = B_0 - \frac{e\mu_0}{4\pi} \sum_{N_1} grad \int_{S_i} \int M_i \cdot \frac{\vec{r}}{r^3} dS_i$$

where, $M_i$ is the total magnetization, namely the sum of the permanent magnetization $M_i^{per}$ and the induced magnetization $M_i^{ind}$ of element i, $N_1$ is the number of elementary surfaces, $L_i$ the edges of the elementary surfaces, $S_i$ the elementary surfaces, r is the distance between the current point of the edge i and the measurement point, $n_i$ is the perpendicular to the edge i of the current surface element, tangential to the element, e is the thickness of the hull.

Numerically, this equation comes down to solving the problem in the following matrix form:

$$B - B_0 = FM = FM^{ind} + FM^{per}$$

This system has the following features:

It is representative of the measurements made by the sensors.

It is a priori undersized, i.e. there are fewer equations than unknowns.

It may be ill-conditioned, i.e. it is difficult to invert, with this difficulty increasing with the number of sensors.

To remedy this drawback, a model of the physical behavior of magnetization is created.

The overall formulation of the physical behavior makes use of knowledge of the geometric model comprised of the surface mesh of the hull and the hull thickness, the inductive field denoted $H_0$, and the relative permeability of the material denoted $\mu_r$. This formulation is written on the basis of the following highly general equation:

$$B = \mu_0(H+M) \quad (1)$$

to which the following equation intrinsic to the material is added:

$$B = \mu H + B_p \quad (2)$$

Combining (1) and (2), we obtain:

$$H = \mu_r H + M - M_p \quad (3)$$

where $M_p$ is the permanent magnetization, $M_i$ is the induced magnetization, and M is the total magnetization. Since $M - M_r = M_i$, we obtain $$M_i = (\mu_r - 1)H$$

$M_i$ is created both by $M_r$ and $M_i$ of the entire sheet. We then have:

$$\frac{M_i^{ind}}{(\mu_r - 1)} = H_0 - \frac{e}{4\pi} \sum_{N_1} \int_{L_j} M_j^{ind} \cdot n_j \frac{\vec{r}_{ij}}{r_{ij}^3} dL_j - \quad (4)$$

$$\frac{e}{4\pi} \sum_{N_1} \int_{L_j} M_j^{per} \cdot n_j \frac{\vec{r}_{ij}}{r_{ij}^3} dL_j$$

or $$\frac{M_i^{ind}}{(\mu_r - 1)} = H_0 + \frac{e}{4\pi} \sum_{N_1} grad \int_{S_j} \int M_j^{ind} \frac{\vec{r}_{ij}}{r_{ij}^3} dS_j +$$

$$\frac{e}{4\pi} \sum_{N_1} grad \int_{S_j} \int M_j^{per} \frac{\vec{r}_{ij}}{r_{ij}^3} dS_j$$

where, $M_j^{ind}$ is the induced magnetization of elementary surface j, $M_j^{per}$ is the permanent magnetization of elementary surface j, $N_1$ is the number of elementary surfaces, $L_j$ the edges of the elementary surfaces, $S_j$ the elementary surfaces, $r_{ij}$ is the distance between the centers of mass of surface elements i and j, $n_j$ is the perpendicular to edge i of the current surface element, tangential to the element, e is the hull thickness, Writing this equation for each element, numerically we obtain the following matrix system:

$$(C+Id)M^{ind}+CM^{per}=f(H_0)$$

where C is a matrix that depends on the mesh of the geometry, the sheet thickness, and the relative permeability μr, Id is the identity matrix, and Mi and Mp are the induced and permanent magnetizations respectively such that M=Mi+Mp.

This system has the following features:
It is representative of the physical behavior of the sheet
It is undersized, i.e. it has more equations than unknowns,
It is well-conditioned, i.e. easy to invert.

The two models must be verified at the same time, which leads to constructing then resolving the following general model:

$$\begin{bmatrix} F & F \\ C+Id & C \end{bmatrix} \begin{bmatrix} Mi \\ Mp \end{bmatrix} = \begin{bmatrix} B-Bo \\ D \end{bmatrix}$$

namely:

$$AM=Y$$

with:

$$A = \begin{bmatrix} F & F \\ C+Id & C \end{bmatrix} \quad M = \begin{bmatrix} Mi \\ Mp \end{bmatrix} \quad Y = \begin{bmatrix} B-Bo \\ D \end{bmatrix}$$

The resulting matrix to be inverted, denoted A, is then of course well-conditioned, hence easy to invert, although the system is undersized; it requires neither an empirical estimate of weighting coefficients nor the use of a particular regularization technique; a generalized inversion by breaking down into singular values is sufficient for the magnetizations to be found.

The inversion enables the estimate of M denoted $\tilde{M}$ to be obtained. The matrix $A_{(X,N)}$ with N>X can be broken down as follows:

$$A_{(X,N)}=P_{(X,N)}L_{(N,N)}Q^T(N,N)$$

where matrices P and Q are orthogonal, i.e.:

$$\sum_{i=1}^{X} P_{ik}P_{in} = \partial_{kn}$$

$$\sum_{j=1}^{X} Q_{jk}Q_{jn} = \partial_{kn}$$

for $$1 \leq k,n \leq N$$

L is a diagonal matrix whose diagonal elements are the eigenvalues of A. L has the following form:

$$L = \begin{bmatrix} l_1 & 0 & 0 & 0 & 0 \\ 0 & \ldots & 0 & 0 & 0 \\ 0 & 0 & l_i & 0 & 0 & 0 \\ 0 & 0 & 0 & \ldots & 0 \\ 0 & 0 & 0 & 0 & l_N \end{bmatrix}$$

We then have $$A^{-1}=QL^{-1}P^T$$

with $L^{-1}$, which amounts to:

$$L^{-1} = \begin{bmatrix} 1/l_1 & 0 & 0 & 0 & 0 \\ 0 & \ldots & 0 & 0 & 0 \\ 0 & 0 & 1/l_i & 0 & 0 & 0 \\ 0 & 0 & 0 & \ldots & 0 \\ 0 & 0 & 0 & 0 & 1/l_N \end{bmatrix}$$

When an eigenvalue $1_i$ is zero, it is replaced by 0 in $L^{-1}$. The estimate of M, $\tilde{M}$ is obtained simply by:

$$\tilde{M}=A^{-1}Y \quad (5)$$

The model, denoted A, associated with the calculation points of the signature denoted S is theoretically written in the same way as the model associated with the measurement points described at 0. It uses knowledge of the geometric model composed of the surface mesh of the hull, the hull thickness, the measurements, the coordinates of the calculation points, and the inductive field $B_0=\mu_0 H_0$ ($\mu_0$ is the permeability of vacuum or air):

$$S = B_0 + \frac{e\mu_0}{4\pi} \sum_{N_1} \int_{L_i} \tilde{M} \cdot n_i \frac{\vec{r}}{r^3} dL_i \quad (6)$$

$\tilde{M}$ represents the estimated magnetizations
$N_1$ is the number of surface elements (triangular or quadrangular facet),
$L_i$ the edges of the elements,
r is the distance between the center of mass of the current surface element and the field calculation point,
$n_i$ is the perpendicular to the edge i of the current surface element, tangential to the element,
e is the hull thickness.

Numerically, this equation comes down to solving a problem that assumes the following matrix form:

$$S=A\tilde{M}$$

hence a simple matrix product.

An additional step consists of offsetting the magnetization of the sheet or its magnetic signature by using a known system of immunization loops disposed in the vicinity of the sheet, in which currents with adjustable intensity I can be generated. For this purpose, a linear system G is established, which is usually well oversized, connecting the currents I to the magnetizations on a hull taking into account the geometries of the hull and the immunization loops. We can then simply write that:

$$\tilde{M}=GI$$

The compensating currents I are then estimated, for example by generalized inversion by breaking down matrix G into singular values, as follows:

$$I=(G^TG)^{-1}G^T\tilde{M}$$

The next step consists of minimizing the function $\tilde{M}-M'$, this minimization of function $\tilde{M}-M'$ being carried out by the least-squares method.

Figure 3:
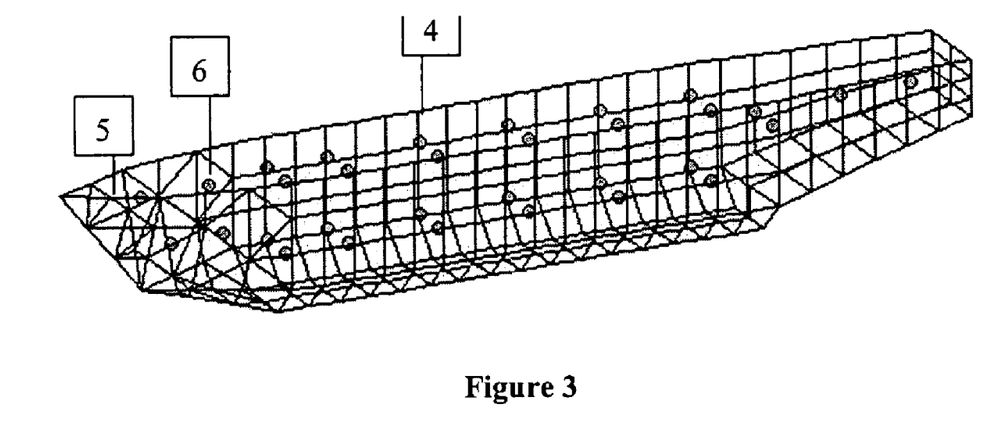
FIG. 3 shows the modeling and surface mesh of a hull.

The method according to the embodiment described above was implemented in a computer-modeled steel hull on which a surface mesh was created as shown in FIG. 3. This model has 271 elementary surfaces which have square shapes 4 or triangular shapes 5. As shown in FIG. 3, 32 triaxial mini-Crouzet sensors 6 were placed inside the hull.

The hull was set on a northern heading so that the earth's field did not have to be simulated. It was thus placed in a highly homogeneous inductive field. The values of this field are:

Box=−553 nT
Boy=−22549 nT
Boy=−40662 nT

The internal sensors 6 were mounted on a structure independent of the hull. In this way, two types of measurements can be made: field measurements inside the model, and hull-less measurements after removal of the hull and replacement of said structure. Simple subtraction enables the reaction of the material to the inductive field to be measured directly while avoiding problems involved in the sensor offsets. The approach is known as a differential approach.

Since the hull mesh divides it into 271 surface elements, there are 542 unknowns to be identified from 99 data, namely 96 measurements from the 32 triaxial sensors 6 plus the three components of the inductive field.

The following three steps were then carried out:

A first modeling of the magnetic field associated with the measurements and as a function of the surface mesh created on the sheet, the sheet thickness, the measurements, the coordinates of the measurement points, and the inductive field $B_0=\mu_0 H_0$, A second modeling of the physical behavior of the material of which the sheet is made based on the mesh, the sheet thickness, the inductive field, and the reversible permeability of the material.

Calculation of the permanent and induced magnetizations of each of the elementary surfaces from said first and second models, and the measurements made by said magnetic field sensors.

The latter step requires matrix inversion. Before inverting the matrix, its breakdown into singular values must be studied. Here, the smaller the singular values, the more difficult it is to invert the system. In particular, if these values are very close to 0, it is then necessary to use regularization methods. These methods are relatively cumbersome for 3D problems.

Figure 4:
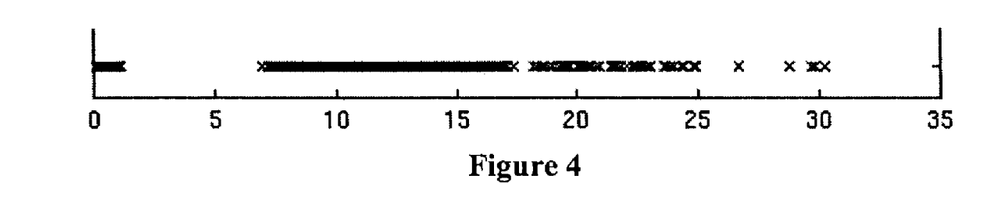
FIG. 4 shows the spectrum of singular values.

This breakdown into singular values, shown in FIG. 4, clearly reveals two groups of values. The first group consists of large values; these are singular values from the first modeling step. We see that this system has a relatively low degree of conditioning. The second group has values far closer to zero and is directly the image of the measurement system that has a very poor degree of conditioning. Thus this contributes to degrading the overall conditioning but to a lesser degree since the number of equations relating to it is small. The overall characteristics of the system to be inverted are:

| Smallest singular value: 0.0753 | Conditioning: 400 |
|---|---|

Thus the system can be inverted by the least-squares method, generalized with no particular precautions. After inversion, we thus obtain remanent and induced magnetizations, the sum being the total magnetization.

Figure 5:
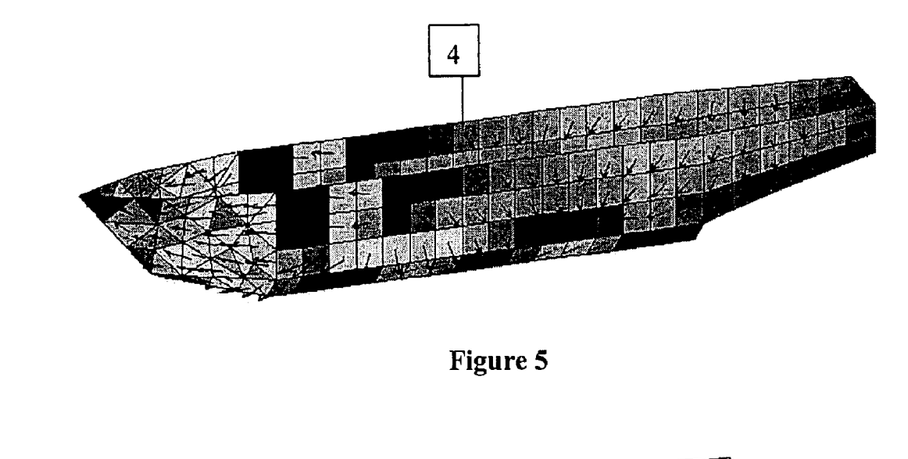
FIG. 5 shows the magnetization of each elementary surface of the surface mesh.

The magnetization of each of the elementary surfaces is shown in FIG. 5 in which the darker the surface, the more intense the magnetization; the direction of magnetization is shown by an arrow.

By application of Equation 6, the magnetic signature of the sheet is calculated at all points from the permanent and induced magnetizations of each of the elementary surfaces, the surface mesh created on the sheet, the sheet thickness, the measurements, the coordinates of the calculation points, and the inductive field $B_0=\mu_0 H_0$.

Figure 6:
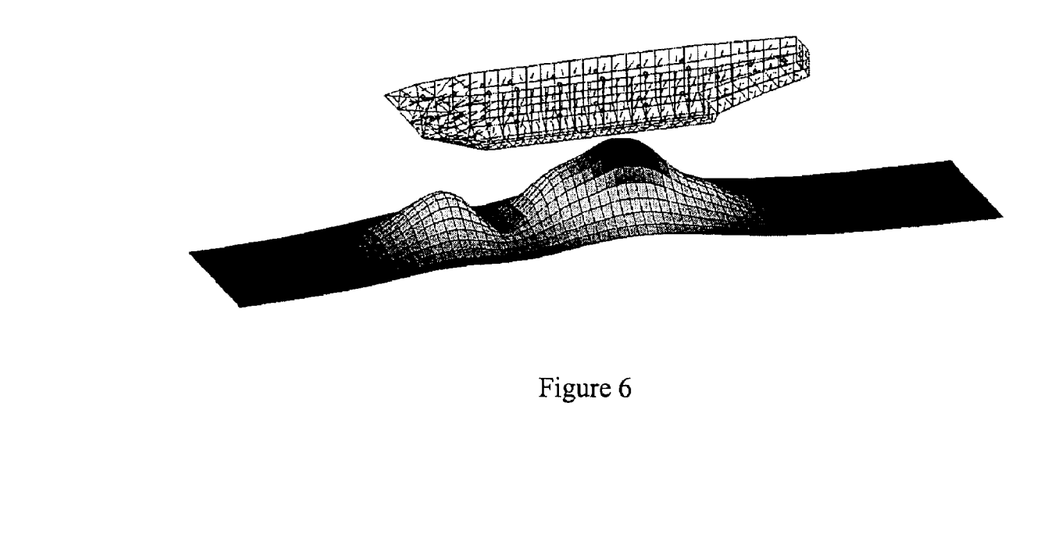
FIG. 6 shows the predicted magnetic signature of the hull.

The modulus of this magnetic signature, and thus of the magnetic anomaly so calculated, is presented in FIG. 6.

To show the match between the calculated signature values and the actual values, seven Ultra type sensors were placed in a horizontal plane located 30 cm below the hull and perpendicularly to the hull axis, and were regularly distributed over a total distance of approximately 1 meter.

Figure 7:
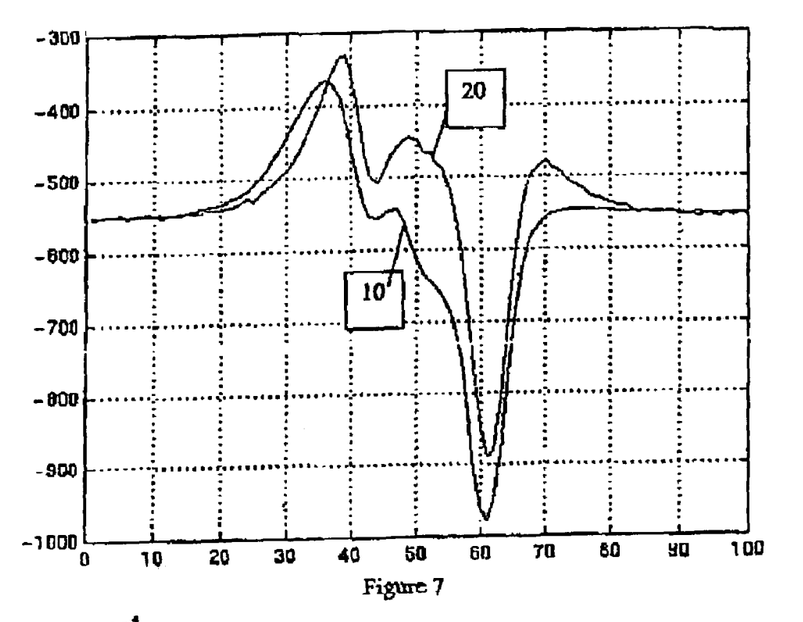
FIGS. 7, 8, and 9 represent, in an orthonormed frame of reference Ox,y,z, the components along the x axis, y axis, and z axis respectively of the magnetic signature of the predicted, measured hull.
Figure 8:
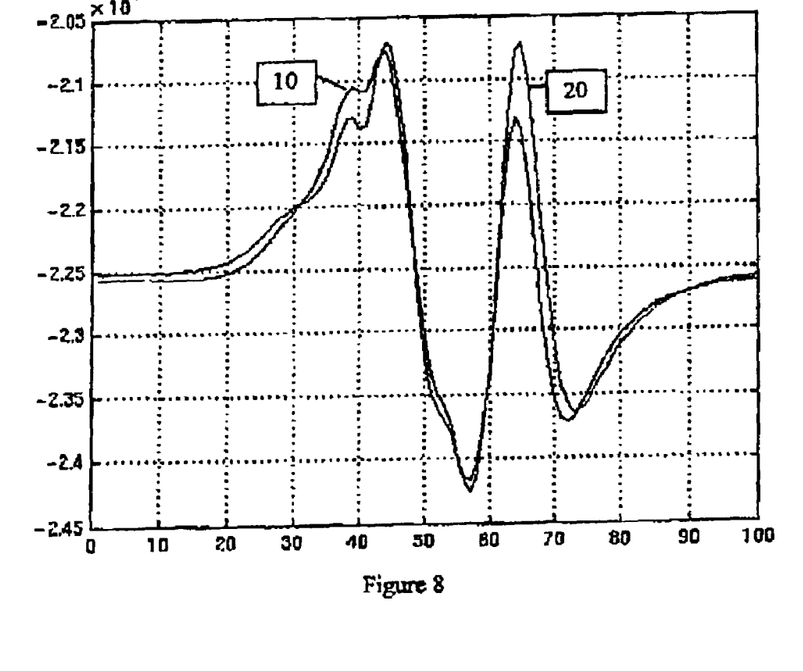
Figure 9:
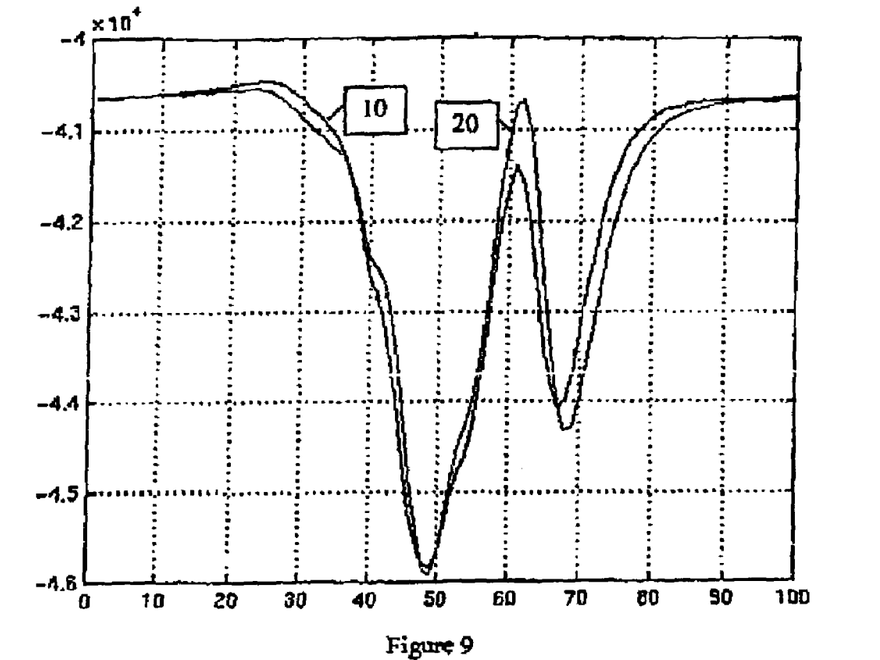

The results are shown in FIGS. 7, 8, and 9 representing the component along the x axis, the y axis, and the z axis of the predicted magnetic signature 10 and measured magnetic signature 20 in an orthonormed frame of reference Ox,y,z.

Each component is presented in nanoTesla units on the ordinate, while the distance relative to the plane of symmetry of the hull is on the abscissa.

It will be noted that there is very good agreement between the predicted and measured signature values. Thus, since the invention enables the magnetization and magnetic signature of the hull to be precisely determined, it is possible to almost completely offset the magnetization of the hull by using a system of immunization loops located near the sheet, and in which a current with adjustable intensity I can be generated, by carrying out a first step consisting of establishing a linear system G connecting the currents I to the magnetizations M' that they generate on the sheet and which is a function of the geometries of the sheet and the loops, and a second step consisting of minimizing the function M−M' by the least-squares method.

What is claimed is:

1. Method for determining magnetization of a field radiated by a ferromagnetic sheet using magnetic field sensors distributed along the ferromagnetic sheet at known positions relative to the ferromagnetic sheet, the method comprising:

Creating a surface mesh of the ferromagnetic sheet by dividing the ferromagnetic sheet into elementary surfaces, Creating a first magnetic field model that is associated with measurements of the magnetic field sensors and which is a function of the surface mesh of the ferromagnetic sheet, a thickness of the ferromagnetic sheet, the measurements of the magnetic field sensors, the coordinates of the known positions, and an inductive field $B_0=\mu_0 H_0$, Creating a second model of physical behavior of the ferromagnetic sheet material from the surface mesh, the thickness of the ferromagnetic sheet, the inductive field, and reversible permeability of the ferromagnetic sheet material, Calculating permanent and induced magnetizations of each of the elementary surfaces from said first and second models and the measurements made by said magnetic field sensors, Calculating a magnetic signature of the ferromagnetic sheet at a plurality of points from said permanent and induced magnetizations of each of the elementary surfaces, from the surface mesh of the ferromagnetic sheet, the thickness of the ferromagnetic sheet, the measurements by the magnetic field sensors, the coordinates of the known positions, and the inductive field $B_0 = \mu_0 H_0$, and Outputting a calculated magnetic signature of the ferromagnetic sheet to allow compensation of the magnetic signature.

2. Method according to claim 1, wherein creating the first model comprises modeling the magnetic field by a formula connecting the magnetic field measured by the sensors, the magnetizations, the inductive field, and the geometry of the ferromagnetic sheet, by one of the following formulas:

$$B = B_0 + \frac{e\mu_0}{4\pi} \sum_{N_1} \int_{L_i} M_i \cdot n_i \frac{\vec{r}}{r^3} dL_i$$

$$B = B_0 - \frac{e\mu_0}{4\pi} \sum_{N_1} grad \int_{S_i} \int M_i \cdot \frac{\vec{r}}{r^3} dS_i$$

where $M_i$ is total magnetization, that is the sum of the permanent magnetization $M_i^{per}$ and the induced magnetization $M_i^{ind}$ of element i, $N_1$ is the number of elementary surfaces, $L_i$ the edges of the elementary surfaces, $S_i$ the elementary surfaces, r is the distance between an edge i and a corresponding one of the known positions, $n_i$ is the perpendicular to the edge i of the elementary surface, tangential to the elementary surface, e is the thickness of the ferromagnetic sheet, namely a matrix system taking the following matrix form:

$B - Bo = FM = FM^{ind} + FM^{per}$.

3. Method according to claim 2, wherein the permanent and induced magnetizations of each of the elementary surfaces are calculated by resolving the following matrix system, its solution being an estimated magnetic signature:

$$\begin{bmatrix} F & F \\ C + Id & C \end{bmatrix} \begin{bmatrix} M^{ind} \\ M^{per} \end{bmatrix} = \begin{bmatrix} B - Bo \\ D \end{bmatrix}.$$

4. Method according to claim 3, wherein the magnetic signature S of the ferromagnetic sheet at a point I is calculated by one of the following formulas:

$$S = B_0 + \frac{e\mu_0}{4\pi} \sum_{N_1} \int_{L_i} \tilde{M}_i \cdot n_i \frac{\vec{r}}{r^3} dL_i$$

-continued $$S = B_0 - \frac{e\mu_0}{4\pi} \sum_{N_1} grad \int_{S_i} \int \tilde{M}_i \cdot \frac{\vec{r}}{r^3} dS_i$$

$\tilde{M}$ represents the estimated magnetic signature $N_1$ is the number of surface elements (triangular or quadrangular facet), $L_i$ the edges of the elements, $S_i$ the surfaces of the elements, r is the distance between the center of mass of the current surface element and the field calculation point, $n_i$ is the perpendicular to the edge i of the current surface element, tangential to the element, e is the thickness of the ferromagnetic sheet.

5. Method according to claim 4, further comprising a first step of establishing a linear system G calculating the magnetizations M' generated on the ferromagnetic sheet by a plurality of electric currents and which is a function of the geometries of the ferromagnetic sheet and immunization loops, and a second step of minimizing the function $\tilde{M} - M'$.

6. Method according to claim 1, wherein creating the second model comprises modeling magnetic behavior of the ferromagnetic sheet material by a formula connecting the magnetizations, the inductive field, the reversible relative permeability of the ferromagnetic sheet material of the ferromagnetic sheet, and the geometry, by one of the following formulas:

$$\frac{M_i^{ind}}{(\mu_r - 1)} = H_0 - \frac{e}{4\pi} \sum_{N_1} \int_{L_j} M_j^{ind} \cdot n_j \frac{\vec{r}_{ij}}{r_{ij}^3} dL_j - \frac{e}{4\pi} \sum_{N_1} \int_{L_j} M_j^{per} \cdot n_j \frac{\vec{r}_{ij}}{r_{ij}^3} dL_j$$

$$\frac{M_i^{ind}}{(\mu_r - 1)} = H_0 + \frac{e}{4\pi} \sum_{N_1} grad \int_{S_j} \int M_j^{ind} \frac{\vec{r}_{ij}}{r_{ij}^3} dS_j + \frac{e}{4\pi} \sum_{N_1} grad \int_{S_j} \int M_j^{per} \frac{\vec{r}_{ij}}{r_{ij}^3} dS_j$$

where, $M_j^{ind}$ is the induced magnetization of the elementary surface j, $M_j^{per}$ is the permanent magnetization of the elementary surface j, $N_1$ is the number of elementary surfaces, $L_j$ the edges of the elementary surfaces, $S_j$ the elementary surfaces, $r_{ij}$ is the distance between the centers of mass of surface elements i and j, $n_j$ is the perpendicular to edge i of the current surface element, tangential to the element, e is the thickness, of the ferromagnetic sheet, namely, as a whole, a matrix system assuming the following matrix form:

$(C+Id)M^{ind} + CM^{per} = f(H_0)$.

7. Method according to claim 1, further comprising a step of offsetting the magnetization of the ferromagnetic sheet or a magnetic signature of the ferromagnetic sheet by using a system of immunization loops and in which a current with adjustable intensity I can be generated.

8. Method according to claim 7, wherein minimizing the function $\tilde{M} - M'$ is carried out by a least squares method.

9. Application of a method according to claim 1 to determine the magnetization and the magnetic signature of a hull of a ship.

10. Application of a method according to claim 1 to determine the magnetization and the magnetic signature of an entire ship.

11. Application of a method according to claim 1 to determine the magnetization and the magnetic signature of a ferromagnetic structure.

* * * * *